United States Patent [19]

Fanshel

[11] Patent Number: 4,837,832
[45] Date of Patent: Jun. 6, 1989

[54] ELECTRONIC HEARING AID WITH GAIN CONTROL MEANS FOR ELIMINATING LOW FREQUENCY NOISE

[76] Inventor: Sol Fanshel, 6 Tatra Ridge Rd., Woodstock, N.Y. 12498

[21] Appl. No.: 111,438

[22] Filed: Oct. 20, 1987

[51] Int. Cl.$^4$ .................... H04R 25/00; H04R 25/04; H03G 3/20; H03G 7/00
[52] U.S. Cl. ................................ 381/68.4; 381/69; 381/71; 381/94; 381/205; 381/107
[58] Field of Search ................. 381/68.4, 68, 69–69.2, 381/71, 73, 94, 104–109

[56] References Cited

U.S. PATENT DOCUMENTS

| | | | |
|---|---|---|---|
| 3,015,704 | 1/1962 | Behymer | 381/68.4 |
| 3,213,372 | 10/1965 | Kurvits | 381/94 |
| 3,678,416 | 7/1972 | Burwen | 381/94 |
| 3,815,039 | 6/1974 | Fujisawa et al. | 381/94 |
| 3,894,195 | 7/1975 | Kryter | 381/68.4 |
| 3,920,931 | 11/1975 | Yanick, Jr. | 381/68.2 |
| 4,025,723 | 5/1977 | Blackledge | 381/106 |
| 4,185,168 | 1/1980 | Graupe et al. | 381/93 |
| 4,381,488 | 4/1983 | Fricke et al. | 381/106 |
| 4,425,481 | 1/1984 | Mansgold et al. | 381/68.2 |
| 4,454,609 | 6/1984 | Kates | 381/68 |
| 4,508,940 | 4/1985 | Steeger | 381/68.4 |
| 4,509,022 | 4/1985 | Ridel | 381/68.4 |
| 4,517,415 | 5/1985 | Lawrence | 381/68.4 |
| 4,543,453 | 9/1985 | Brander | 381/68.4 |
| 4,596,902 | 6/1986 | Gilman | 381/68.2 |
| 4,617,536 | 10/1986 | Richard | 337/37 D |
| 4,622,440 | 11/1986 | Slavin | 381/68.1 |
| 4,622,692 | 11/1986 | Cole | 381/94 |
| 4,630,304 | 12/1986 | Borth et al. | 381/94 |

FOREIGN PATENT DOCUMENTS

| | | | |
|---|---|---|---|
| 3127670 | 1/1983 | Fed. Rep. of Germany | 381/68 |
| 3602000 | 9/1986 | Fed. Rep. of Germany | 381/68 |
| 2571580 | 4/1986 | France | 381/68 |

OTHER PUBLICATIONS

*Hearing Instruments,* Nov. 1987, p. 63, "Williams Sound Corporation ad".
"Fitting the Environment—Some Evolutionary Approaches" by E. Robert Libby and Robert Sweetow, PhD, Hearing Instruments, vol. 38, No. 8, 1987, pp. 8–16.

*Primary Examiner*—Jin F. Ng
*Assistant Examiner*—Danita R. Byrd
*Attorney, Agent, or Firm*—Brumbaugh, Graves, Donohue & Raymond

[57] ABSTRACT

Electronic circuitry is described which enhances the intelligibility of a speech signal corrupted by low-frequency noise and certain flaws of miniaturized hearing aids are overcome by packaging the circuitry in a housing to be worn on the body of the hearing-impaired person and electrically coupling the output of the circuit to a high quality of a type to be worn in the ear speaker. The circuitry includes a low-frequency channel which passes components of the speech signal between about 600 Hz and about 1.2 KHz, and a parallel high-frequency channel which passes speech signal components between about 1.7 KHz and 4.6 KHz. The high-frequency channel includes a gain control amplifier for compressing the dynamic range of high-frequency components and means for adjusting the level of the compressed high-frequency signal relative to the level of signals passed by the low-frequency channel. The low-frequency and high-frequency signals are combined in a summing amplifier, the output level of which is controlled by a volume control and then amplified in power sufficiently to drive a wide dynamic range external speaker.

7 Claims, 2 Drawing Sheets

ELECTRONIC HEARING AID WITH GAIN CONTROL MEANS FOR ELIMINATING LOW FREQUENCY NOISE

BACKGROUND OF THE INVENTION

This invention relates generally to hearing aids and, more particularly, to hearing aid control circuits for enhancing the intelligibility of speech signals corrupted by low-frequency noise.

Hearing aids presently available are miniaturized so as to fit into the ear canal or over the ear, the main motivation for which is to make the aid unobstrusive. This stems from the myth that a hearing impairment is a sign of decrepitude in an elderly person, or a handicap for a young person. A similar myth existed a generation ago in respect of the wearing of eyeglasses, but this image has now been removed and there no longer is any stigma attached to wearing them.

Because of the flaws in presently available hearing aids many of the millions of hearing-impaired persons, even after having been fitted for hearing aids and paid their not insignificant cost, do not use them. While the art of hearing aids is generally well known and well understood, hearing aid users continue to suffer from the fact that most hearing aids are non-discriminating and therefore equally amplify audio information and background noise. As reported in *Hearing Instruments,* Vol. 38, No. 8, 1987, pp. 8-16, the most common complaint reported by hearing instrument wearers is that speech was difficult to understand under noisy and reverberant conditions. Studies have shown that listening conditions which are just mildly disruptive for normalhearing persons have serious consequences for understanding speech for hearing-impaired subjects. A normal hearing person in quiet, because the speech is rich in redundant cues, can tolerate a substantial amount of degradation of the speech signal before it becomes unintelligible. However, the set of cues available, especially the crucial high frequency cues, are substantially reduced for the typical hearing-impaired listener, and in noisy, reverberant environments the reduction in available speech cues usually reduces the remaining low frequency information, resulting in further degradation of the primary signal. Additionally, currently available aids cause discomfort to the user when a sudden loud noise occurs, their limited range makes them very ineffective for use in theatres and conference halls, and generally have poor tone quality. Furthermore, the adjustment controls on the hearing aid not only are very small but because of their location on the device (which must be in place in the ear canal or over the ear during adjustment) are very difficult to manipulate.

These flaws of available hearing aids are directly attributable to their miniature size which results in components that are too small to meet the fundamental objective of an effective hearing aid that for normal sounds the acoustic output should be a clear but amplified copy of the input signal. The microphone usually used as the transducer for converting an acoustic input to an electric signal is extremely small and because of its location on the hearing aid device is quite directive (but not necessarily sufficiently or in the right direction). Similarly, the powerhandling capability and the dynamic range of the miniature speaker used in the present hearing aids are extremely limited, factors which contribute to the above-outlined flaws.

Accordingly, there is a need for a hearing aid that can be relatively unobstrusively coupled to the ear which has more power-handling capability and a wider dynamic range than the miniature speaker used in available hearing aids.

Additionally, it is desirable that a hearing aid have the capability of using a variety of superior microphones each tailored for a particular purpose: for example, a built-in microphone for convenience; a plug-in directional microphone to aid in noise control; a plug-in power-enhanced microphone for use in theatres and conference rooms; a plug-in or induction coil telephone pickup.

Moreover, the frequency response of the hearing aid desirably is adjustable to compensate for the frequency losses of the hearing-impaired user, and to enable the user to listen to speech in the midst of ambient background noise.

SUMMARY OF THE INVENTION

Generally speaking, the hearing aid according to the present invention overcomes the flaws of presently available miniaturized hearing aids by packaging the control circuit in a container separate from the ear-piece and sufficiently small in size as to be carried in the user's shirt pocket or attached to a belt, and with a wire connecting the control circuit to a quality speaker that fits in the ear. The speaker may be of the type currently used with portable radio receivers and/or tape players, such as the Sony "Walkman", which is capable of handling much more power and has a wider dynamic range than the miniature speakers typically found in present hearing aids. This available type of speaker is easily inserted into the ear and is more comfortable than a molded plastic hearing aid that is inserted in the ear canal, which can become irritating when worn for long periods. If the wire for the ear speaker is made flesh colored it is quite unobtrusive.

In another aspect the invention provides apparatus for enhancing the intelligibility of an electric speech signal corrupted with low-frequency noise. The apparatus permits adjustment of the frequency response of the circuit to compensate for the frequency losses of the user and includes a low-frequency, or bass, channel and a high-frequency, or treble, channel for producing a signal to the ear corresponding to the frequency characteristic band of the speech signal. Because the most troublesome noises are in the low-frequency range, the treble response can be enhanced relative to the bass channel, thereby to improving intelligibility of the crucial consonants, which are primarily high-frequency speech elements. The high-frequency channel includes a signal compressor, the control circuit of which includes means for quickly suppressing bursts of loud noise occurring in the treble range and removing the suppression at a rate so as to prevent unwanted distortion of speech elements. The low-frequency and high-frequency signals are combined by simple summation to produce an output signal to a power amplifier for application to the speaker.

BRIEF DESCRIPTION OF THE DRAWINGS

Other objects, features and advantages of the invention, and a better understanding of its construction and operation, will be had from the following detailed description, taken in conjunction with the accompanying drawings, in which.

DETAILED DESCRIPTION OF THE INVENTION AND PREFERRED EMBODIMENT

Figure 1:
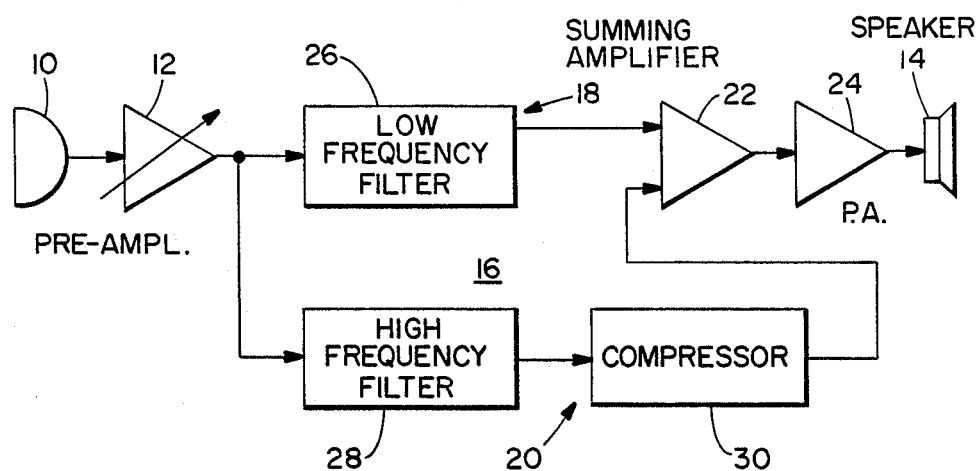
FIG. 1 is a block diagram of electronic apparatus embodying the invention.

FIG. 1 is a block diagram of a hearing aid according to the invention which includes a microphone 10 for producing an audio frequency electrical signal representing speech sounds incident thereon; a conventional preamplifier 12 for amplifying the electric speech signal; a speaker 14 to which a processed speech signal is delivered for audible reproduction; and an electronic control circuit 16 for processing the speech signal which serves to enhance the intelligibility of the speech signal in the presence of low-frequency noise.

The control circuit 16 has a low-frequency, or bass channel 18, a high-frequency, or treble, channel 20 connected in parallel therewith, and a summer 22 for combining signals transmitted by the low-frequency and high-frequency channels. Typically, summer 22 is an operational amplifier in a conventional summing configuration, and its output is amplified by a suitable power amplifier 24 and ailed to speaker 14.

The low-frequency channel 18 essentially is a bandpass filter 26 having cut-off frequencies on the order of 600 Hz and 1.2 KHz. The cut-off frequency of 600 Hz, which is amenable to some variation, was chosen because in many environments, such as restaurants, airports and train stations, the ambient, low-frequency noise which would corrupt a speech signal is likely to have most of its spectral energy concentrated below about 600 Hz, and low frequency acoustical cues would not be significantly affect.

The first component of high-frequency channel 20 is a band-pass filter 28 having cut-off frequencies about 1.7 KHz and 4.6 KHz. Filters 26 and 28 are so designed that their response characteristics overlap in the vicinity of 1.5 KHz in order to prevent loss of frequency components present in the original sound signal when the two signals are summed. The dynamic range of the high-frequency components signal passed by filter 28 is compressed by a compressor 30 which also serves to suppress loud bursts of noise that would otherwise cause discomfort. The user can control the level of the high-pass signal appearing at the output of compressor 30 relative to the fixed level of the low-frequency signal for optimum intelligibility of the speech signal for his particular hearing impairment. Because the high-frequency channel contains frequency components typical of consonants, which are important to intelligibility, the system can be adjusted so as to emphasize the higher frequencies relative to the low frequencies and thereby effectively suppress the noise.

Figure 2:
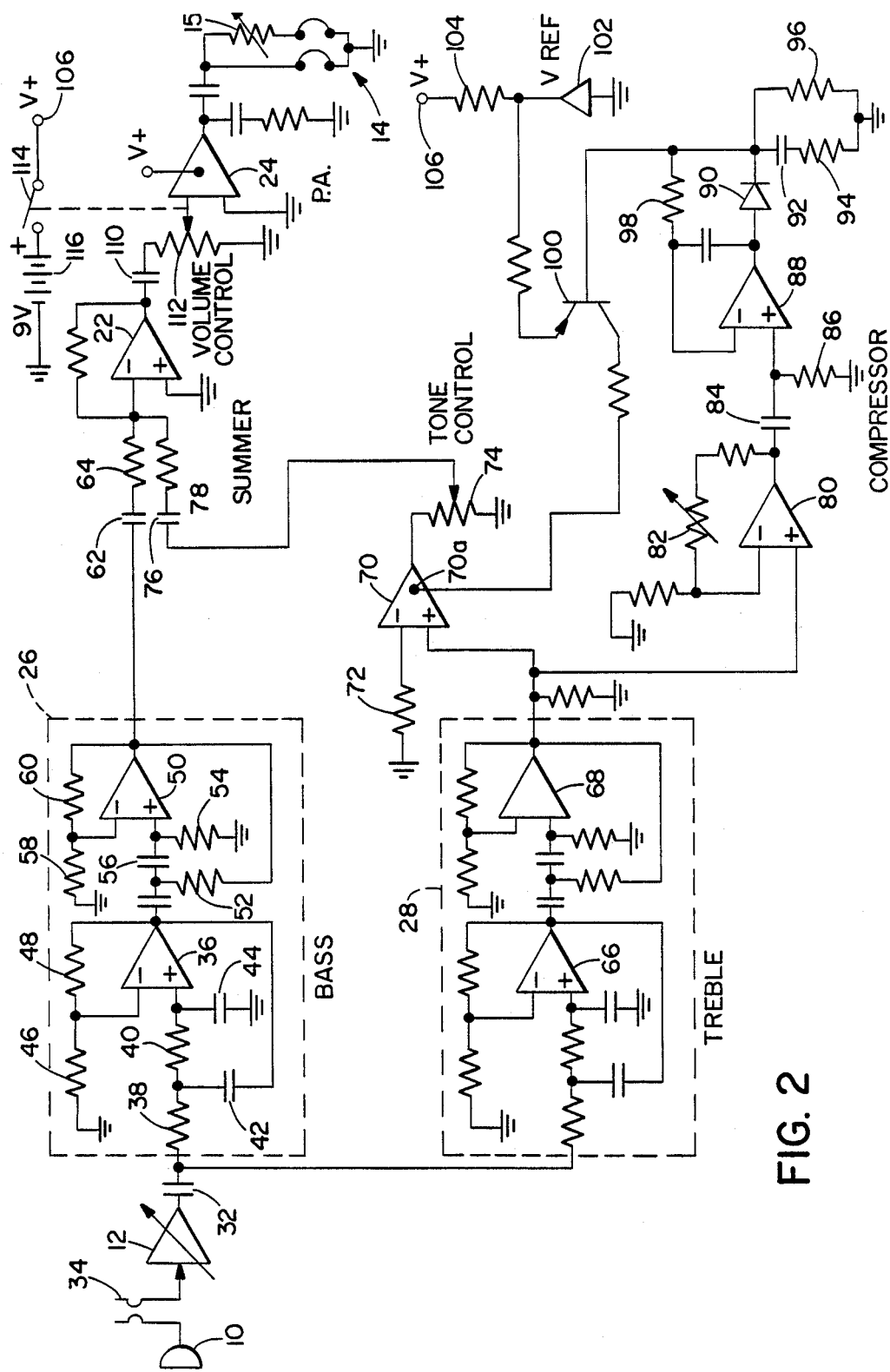
FIG. 2 is a schematic circuit diagram of a practical embodiment of the apparatus of FIG. 1.

FIG. 2 schematically illustrates a preferred and practical embodiment of signal processing circuit 16. The speech signal received from microphone 10, which may be built into a suitable package (to be described in connection with FIG. 3) is amplified by a preamplifier 12, the gain of which is adjustable to control the gain level of the system, and coupled via a coupling capacitor 32 to a low-frequency, or bass, filter 26, and also to a high-frequency, or treble, filter 28. A conventional microphone jack 34 is connected between microphone 10 and preamplifier 12 so that an external microphone (not shown) can be plugged in and produce the input speech signal instead of microphone 10. The jack 34 is designed and constructed to disconnect the built-in microphone 10 when an external microphone is plugged in. Filters 26 and 28 preferably are active, equal-component bandpass filters, such as the illustrated Sallen-Key second order filters, each consisting of a "low-pass" section followed by a "high-pass" section. More specifically, and with reference to filter 26, the "low-pass" section consists of an operational amplifier 36, a pair of series-connected resistors 38 and 40 through which the input signal is applied to the non-inverting input of the amplifier, a capacitor 42 connected between the junction of resistors 38 and 40 and the output terminal of amplifier 36, a capacitor 44 connected between the non-inverting input terminal and ground, and a voltage dividing network consisting of resistors 46 and 48 connected between the output terminal of amplifier 36 and ground for applying a feedback voltage to the inverting input. The circuit components have values to give this "low-pass" filter a cut-off frequency of about 1.2 KHz.

The signal produced at the output of amplifier 36 is capacitatively coupled to the "high-pass" section which consists of an operational amplifier 50, an RC network including resistors 52 and 54 and a capacitor 56, and a network of resistors 58 and 60 for applying a feedback signal to the inverting terminal of the amplifier. The values of the resistors and capacitors are chosen to give this "high-pass" section a cut-off frequency of about 600 Hz and the two-stage filter a pass band from about 600 Hz to about 1.2 KHz. The output signal from filter 26 is coupled via a capacitor 62 and a resistor 64 to the inverting input of summing amplifier 22.

High-frequency filter 28 has the same configuration as filter 26 and consists of operational amplifiers 66 and 68 and associated resistors and capacitors having values chosen to give the two-stage band-pass filter cut-off frequencies of about 1.7 KHz and 4.6 KHz. The respective passbands of the filters suitably overlap in the region of 1.5 KHz to prevent loss of any frequency components present in the input signal when the two filter outputs are combined.

The output signal from filter 28 is applied to the non-inverting input terminal of an operational transconductance amplifier 70, which may be integrated circuit Model CA3080, commercially available from RCA Corporation, the inverting input of which is connected through a resistor 72 to ground and the gain of which is controllable by a DC voltage applied to its control terminal 70a.

The ability to control certain characteristics of the treble signal makes it possible to address the common type of hearing impairment of extreme loss of high tones, which occurs even when there is no noise problem. That is to say, even in a quiet environment, because the loss of response to high tones, known as recruitment, reduces the dynamic range of the signal that the person can hear, it is necessary to raise the level of the high frequency components by an amount sufficient to compensate for the hearing loss before the person can even hear the signal. On the other hand, the level of output signals resulting from loud input signals desirably is limited so as never to become so loud as to be uncomfortable. In order to raise the level sufficiently to be heard by the hearing-impaired person without exceeding the person's loudness discomfort level, or tolerance level, the treble signal in channel 20 is compressed in order to accommodate to the person's limited useful dynamic range. Conceptually, to achieve this desired result the dynamic range of the treble signal is first compressed and then the level of the resultant compressed signal is boosted in gain to fit the signal into the person's available dynamic range. Individuals differ greatly, however, in perception threshold level as well in the sound level that they can comfortably tolerate; therefore, the available dynamic range available to a person having an extreme high frequency loss is very narrow, whereas a person with a less severe high frequency loss would have a wider available dynamic range. Therefore, the amount of compression to which the treble signal is subjected should be adjustable to satisfy the requirements of the individual user.

The high-frequency signal in the treble channel is compressed by amplifier 70, the gain of which is controlled by a DC voltage applied to its control terminal 70a which is produced by a control signal generating circuit in response to the alternating treble signal appearing at the output of filter 28. The control circuit includes an operational amplifier 80 connected to receive the treble signal at its non-inverting input and having a variable resistor 82 connected in the feedback path from its output to its inverting input for providing gain adjustment. The output of amplifier 80 is coupled via a coupling network including a capacitor 84 and a resistor 86 to the non-inverting input of a second operational amplifier 88 for further amplifying the treble signal and producing at its output terminal an amplified high-frequency signal having frequency components extending over the range from about 1.7 KHz to about 4.6 KHz. A DC signal for controlling the gain of amplifier 70 is produced by converting the alternating current signal appearing at the output of amplifier 88 to a DC voltage by a rectifier circuit including a diode 90 and a smoothing circuit including a capacitor 92 and a resistor 94 connected in series from the cathode of diode 90 to ground, and a resistor 96 connected in parallel with the series combination. The cathode of diode 90 is also connected via a resistor 98 to the inverting input terminal of operational amplifier 88 and to the base electrode of PNP transistor 100 which serves to couple the DC signal to the control electrode 70a of amplifier 70. The emitter electrode of transistor 100 is maintained at a fixed voltage by a voltage regulator device 102 which functions like a Zener diode and may be the integrated circuit chip Model LM385 voltage regulator available from National Semiconductor, for example, connected in series with a resistor 104 between a source of positive potential, V+, represented by terminal 106, and ground. By maintaining the emitter voltage constant, the collector electrode responds only to variations in the level of the DC voltage applied to the base of the transistor. When the level of the rectified voltage applied to the base of transistor 100 increases, the collector voltage, being the difference between the fixed reference voltage and the voltage applied to the base electrode, decreases in a linear relationship, and when applied to the control terminal 70a causes the gain of amplifier 70 to decrease thereby compressing the treble signal. Conversely, a decrease in level of the voltage applied to the base of transistor 100 causes an increase in level of the control signal which, in turn, causes the gain of amplifier 70 to increase. Although the magnitude of the control signal varies linearly in inverse proportion with changes in the level of the rectified treble signal, the operation of amplifier 70 is such that its output does not change linearly but, instead, has a gain characteristic that is substantially parabolic in shape so as not to cause harmonic distortion in the amplified speech signal.

After the dynamic range of the treble signal has been compressed, the amount of compression being adjustable by the variable resistor 82, the output compressed treble signal, the level of which may be adjusted by a tone control potentiometer 74 to fit the signal into the range available to the individual user, is coupled via a capacitor 76 and a resistor 78 to the inverting input terminal of operational amplifier 22 which adds it to the low-frequency signal passed by channel 16. Thus, the hearing-impaired person can alter the relative contribution of high- and low-frequency components to the signal produced at the output of amplifier 22. The tone control potentiometer 74 provides an approach to a solution to the common complaint of many hearing aid users "I can hear, but I can't understand" by raising the level of high frequency components of the speech signal relative to the lows until a threshold is reached where the listener hears enough speech clues to understand what is being said.

An important feature of the described compressor circuit is that it prevents loud bursts of sound or other transients from ever becoming so loud as to be uncomfortable to the hearing aid user. This is achieved by designing the RC smoothing network for diode 90 to have a very short attack time constant, of the order of one millisecond, so as to quickly respond to suppress the transient and to have a much longer release time constant, typically on the order of 100 milliseconds. If the release time is short relative to the time duration of a speech syllable, the circuit may suppress the beginning but not the rest of a syllable and possibly causing distortion of a crucial speech element. On the other hand, if the release time is too long an entire multi-syllable word, or perhaps several words, might be suppressed. Although a release time of 100 milliseconds has been found satisfactory, published research results suggest that the release time may be as short 60 milliseconds and as long as 150 milliseconds; thus, the release time is not critical.

The sum of the low-frequency signal from channel 18 and the compressed treble signal from channel 20 appearing at the output of summing amplifier 22 is coupled via a capacitor 110 and a volume control potentiometer 112 to the input of power amplifier 24, which has sufficient power-handling capability to drive a quality speaker 14 having a relatively wide dynamic range. Whereas all of the other integrated circuit chips in the system only drive the inputs of other chips and therefore require very little power in operation, the benefit of using a quality speaker can be realized only if it is driven with adequate power. Instead of the microwatts range of power required to drive the miniature speaker of an in-the-ear type of hearing aid, the speaker contemplated for use in the present circuit, such as the currently available stereophonic in-the-ear type used with the Sony "Walkman" device, for example, requires driving power in the range from 30 to 50 milliwatts. Therefore, power amplifier 24, which may be integrated circuit Model 386N manufactured by National Semiconductor, must be capable of raising the power level of the small signal delivered by amplifier 22 to a level sufficient to drive speaker 14 without distortion. Potentiometer 112 serves as the volume control for the hearing aid and, as indicated by the dashed line, is associated with an ON-/OFF switch 114 for the power supply, schematically illustrated as a 9-volt battery 116 having its positive terminal connected via switch 114 to terminal 106.

Figure 3:
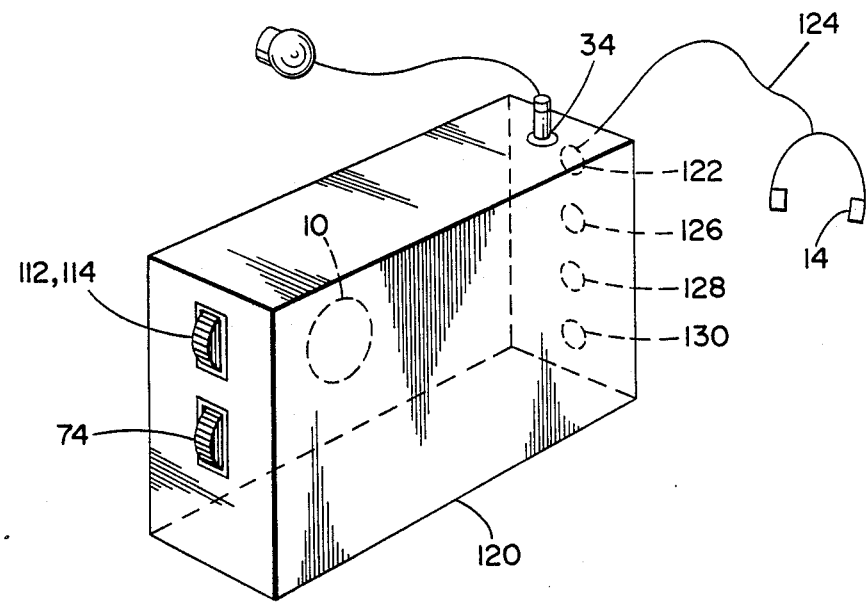
FIG. 3 is a perspective view illustrating a preferred form of packaging for the electronic apparatus.

Referring now to FIG. 3, for maximum realization of the advantages of the invention, the circuit of FIG. 2, less the speaker 14, is preferably packaged in a box-like container 120 of a size suitable for carrying in a shirt pocket or to be clipped to a belt. For general-use convenience, the unit has a built-in microphone 10, and also has a conventional microphone jack 34 to permit plugging in other types of microphones. The built-in microphone together with the noise control provided by circuit 16 would usually be satisfactory for normal circumstances and social conditions, such as in a group eating at a restaurant or similar social gathering. However, if ambient noise should become intensive, or the conversation of people surrounding the hearing-impaired person begins to mask the speech of the person with whom he is conversing, the user may, if desired, plug in an alternative, more directional, microphone which can be either focused at or placed nearer to the speaker, so as to increase the level of the received signal and at the same time screen out signals arriving from other directions. Or, if a hearing-impaired person sitting at one end of a long conference table wishes to hear voices of conferees at the other end of the table, he can plug in a commercially available supplemental microphone having its own built-in power supply and capable of picking up sounds from considerable distances. Such a supplemental microphone could also be used at the movies or the theatre to enable the hearing-impaired to hear as well as see the performance. Also, a commercially available magnetic pick-up of the kind adapted for attachment to a telephone handset plugged in to the microphone jack 34 would enable the hearing-impaired better to hear a telephone conversation than by putting the telephone earpiece to his ear. The described packaging of the hearing instrument provides an adaptability and flexibility totally lacking in the tiny OTE and ITE hearing aids.

The ON/OFF switch 114 and volume control 112, and the tone control 74, are actuated by respective thumb wheels preferably mounted on one end wall of the package. The package is sufficiently large to accommodate thumb wheels of a size to be conveniently operated by elderly persons who might also lack tactile dexterity.

A speaker jack 122, preferably of a type to accommodate stereo speakers, is provided on the other end wall for receiving a connector affixed to one end of a wire 124 of suitable length, preferably flesh-colored, for connecting the speaker 14 to the control circuit. Three holes 126, 128 and 130 in the end wall, below the speaker jack, provide screw driver access for infrequent adjustment of balance, compressor and pre-amp controls. The "balance" control, schematically shown in FIG. 2 as a variable resistor 15, is associated with the stereo jack and compensates for any difference in hearing levels of the two ears of the person being fitted with the hearing instrument. The "compressor"control adjusts variable resistor 82 (FIG. 2) to set the compression level of the compressor, and the "pre-amp"adjustment controls the gain of preamplified 12 and thus the level of the system to reduce the gain requirements of the power amplifier.

As an alternate to the packaging shown in FIG. 3, the disclosed control circuit can readily be packaged along with the circuitry of any of the commercially available portable radio receivers of the "Walkman" type, in the same housing, and providing a switch on the housing for selecting between the hearing aid function and the radio receiver function.

Although a currently preferred embodiment of the hearing instrument has been described, changes or modifications will now occur to those skilled in the art without departing from the spirit or scope of the invention as set forth in the following claims.

I claim:

1. A hearing aid device for the compensation of hearing deficiencies and for enhancing the intelligibility of audio-frequency speech signals corrupted by low frequency noise, said device comprising:

a signal input transducer for converting input audio speech signals to electric speech signals, an output terminal adapted for connection to an output transducer for supplying acoustic output signals compensated for a hearing deficiency of a hearing-impaired person, and a control circuit having an input terminal connected between the output side of said input transducer and said output terminal, said control circuit comprising:

summing means for summing signals applied thereto and producing a sum signal;

a low-frequency channel, including a first band-pass filter, connected between said input terminal and said summing means for coupling to said summing means a low-frequency signal which is substantially free of frequency components above a selected frequency;

a high-frequency channel connected in parallel with said low-frequency channel between said input terminal and said summing means and comprising:

a second band-pass filter connected to said input terminal for producing from said electric speech signal a high-frequency signal which is substantially free of frequency components below said selected frequency, a variable gain amplifier connected to the output of said high-pass filter and having a gain control terminal and an output terminal, for compressing said high-frequency signal and producing a compressed high-frequency signal at its output terminal, means for generating a control signal for controlling the gain of said amplifier including means connected to the output of said high-frequency filter for controllably amplifying said high-frequency signal, means for rectifying said amplified high-frequency signal, and means for comparing the level of such rectified high-pass signal against a reference level and applying to said gain control terminal a signal proportional to the difference, for varying the gain of said amplifier inversely with the amplitude of said rectified high-frequency signal, and a potentiometer connected between the output terminal of said amplifier and said summing means for coupling a controllable portion of said compressed high-frequency signal to said summing means;

a power amplifier having an input terminal and an output terminal connected to said device output terminal; and a potentiometer connected between the output of said summing means and the input terminal of said power amplifier for coupling a controllable portion of said sum signal to said power amplifier.

2. A hearing aid device according to claim 1, wherein, in said control signal generating means, said means for controllably amplifying said high-frequency signal comprises an operational amplifier having a variable feedback resistor for adjusting its gain, said rectifying means comprises means responsive to said amplified high-frequency signal for deriving a DC voltage proportional thereto, and said means for comparing comprises a source of reference DC voltage of a fixed predetermined level, and a transistor having an emitter electrode connected to said source of reference DC voltage, a base electrode connected to receive said DC voltage from said rectifying means and a collector electrode connected to the control terminal of said variable gain amplifier.

3. A hearing aid device according to claim 2, wherein the means in said control signal generating means for rectifying said amplified high-pass signal has attack and release time constants having such relative durations as to suppress transients in said amplified high-frequency signal caused by loud noise bursts without objectionable loss of speech components.

4. A hearing aid device according to claim 3, wherein said means for rectifying has an attack time constant of about one millisecond and a release time constant in the range from about 60 milliseconds to about 150 milliseconds.

5. A hearing aid device according to claim 1, wherein said device is packaged in a housing adapted to be worn on the body of the hearing-impaired person and electrically connected to an output transducer worn in at least one ear of such person.

6. A hearing aid device according to claim 5, wherein said input transducer is a microphone built into said housing and connected to said control circuit.

7. A hearing aid device according to claim 6, wherein said device further comprises means connected between the output side of said input transducer and the input terminal of said control circuit adapted to connect an external microphone, instead of said built-in microphone, to said control circuit.

* * * * *

UNITED STATES PATENT AND TRADEMARK OFFICE
CERTIFICATE OF CORRECTION

PATENT NO. : 4,837,832

DATED : June 6, 1989

INVENTOR(S) : Sol Fanshel

It is certified that error appears in the above-identified patent and that said Letters Patent is hereby corrected as shown below:

Col. 2, line 51, "improving" should read --improve--.
Col. 3, line 27, "ailed" should read --applied--.
Col. 3, line 37, "affect" should read --affected--.
Col. 5, line 7, before "in" insert --as--.
Col. 6, line 21, "clues" should read --cues--.
Col. 6, line 40, after "short" insert --as--.
Col. 7, line 62, "preamplified" should read --preamplifier--.

Signed and Sealed this

Seventeenth Day of April, 1990

Attest:

HARRY F. MANBECK, JR.

*Attesting Officer*     *Commissioner of Patents and Trademarks*